United States Patent [19]

Sicola et al.

[11] Patent Number: 5,479,413
[45] Date of Patent: Dec. 26, 1995

[54] METHOD FOR TESTING LARGE MEMORY ARRAYS DURING SYSTEM INITIALIZATION

[75] Inventors: Stephen J. Sicola, Monument; Wayne H. Umland, Colorado Springs, both of Colo.

[73] Assignee: Digital Equipment Corporation, Maynard, Mass.

[21] Appl. No.: 254,816

[22] Filed: Jun. 6, 1994

[51] Int. Cl.[6] .................................................. G01R 31/28
[52] U.S. Cl. ........................................ 371/21.1; 371/21.2
[58] Field of Search ........................... 395/575; 371/21.1, 371/21.2, 21.3

[56] References Cited

U.S. PATENT DOCUMENTS 4,891,811   1/1990   Ash et al. .............................. 371/21.2
5,155,844  10/1992   Cheng et al. ........................... 395/575

Primary Examiner—Vincent P. Canney
Attorney, Agent, or Firm—Arthur W. Fisher; Ronald C. Hudgens

[57] ABSTRACT

An improved method for testing a large memory array of a digital computer system during system initialization or reset. First, the memory test method checks the whole memory array for addressing faults, and then a first portion of the memory array for both address line and data failures. While operational firmware is loaded into and begins to execute from the tested first portion, the remaining address locations of the array are tested in a background task. Beginning at the last address of the first portion, sequential portions of memory array are tested and released to the functional code as they have been tested.

5 Claims, 7 Drawing Sheets

METHOD FOR TESTING LARGE MEMORY ARRAYS DURING SYSTEM INITIALIZATION

FIELD OF THE INVENTION

The invention relates generally to digital computer systems, and more specifically to a method for testing a large memory array of a digital computer system.

BACKGROUND OF THE INVENTION

When a digital computer system is initialized upon power-up or reset, the entire system memory is usually tested for both address line and data faults. This is typically accomplished by writing a unique data pattern to every memory location starting at the lowest address and ending at the highest address. The contents of each location are then read and compared to the expected data to determine if the stored data pattern is correct. The inverse of the pattern may then be written to each memory location in the same ascending or even descending sequential order. Again, the data pattern is read and compared to ensure correct addressing and data integrity.

Although the type of method described above will detect both address line failures and a large portion of data failures within the array, the time required by such a test method to test a large memory array makes this approach unacceptable to the system user.

Therefore, a need exists to provide an improved method of achieving reduced initialization time without compromising the level of critical fault test coverage or limiting system performance while testing large memory arrays.

SUMMARY OF THE INVENTION

Accordingly, it is an object of the present invention to test a large memory array of a digital computer system by an improved method which checks the whole array for critical stuck-at faults in address lines that could conceivably cause undetected errors in the operational firmware.

It is a further object of the present invention to verify the integrity of individual memory cells of the entire array without significant delay to the start of system operation.

In a broad sense, the above and other objectives are attained by a memory test method which tests first the addressing hardware of the whole memory array, and then a first portion of the memory array. While operational firmware is loaded into and begins to execute from the tested first portion, the remaining address locations of the array are tested in a background task. Sequential portions of memory, beginning at the last address of the first portion, are tested and turned over to the functional code as they have been tested.

The improved test method of the present invention offers several advantages. It is sequenced in time such that any potential stuck-at faults in address lines of the array are detected before the more extensive (and time-consuming) testing of the individual memory cells is performed. The latter test is performed on a first portion of the array large enough to enable startup of the functional code and the remainder is tested in a background task, which turns over successfully tested pieces of the memory array to the operational firmware over time. Thus, the test method is designed to reduce the delay associated with a system startup sequence due to memory testing and, in so doing, accelerate the availability of system memory for use by functional software.

BRIEF DESCRIPTION OF THE DRAWINGS

The above objects, features and advantages of the present invention will become more apparent from the following detailed description taken in conjunction with the accompanying drawings, in which.

DESCRIPTION OF THE PREFERRED EMBODIMENT

Figure 1:
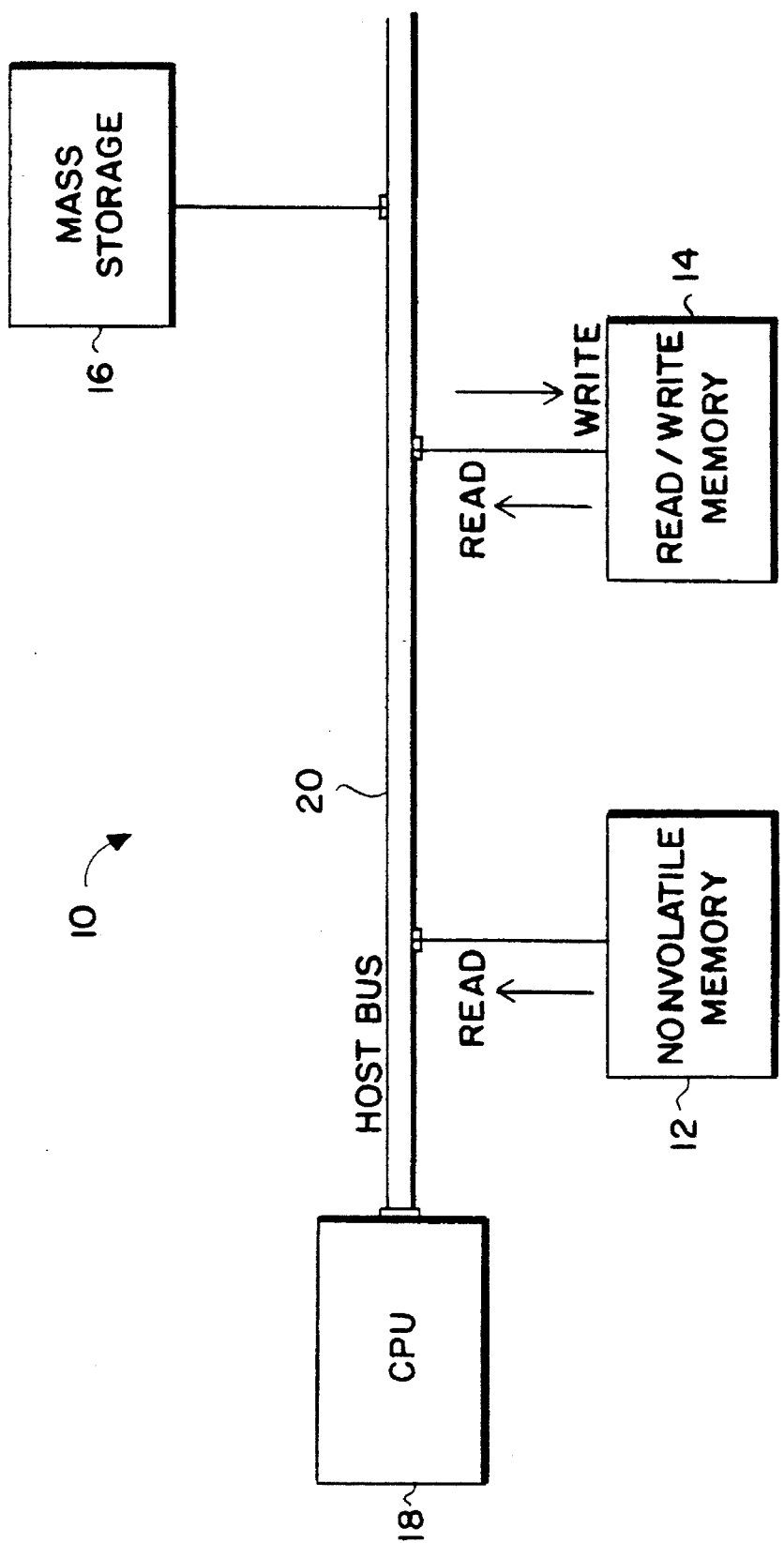
FIG. 1 is a block diagram of a simplified computer system which includes a read/write memory array that may be tested by a test method according to the present invention.

Referring to FIG. 1, a computer system 10 includes a nonvolatile memory 12, a read/write memory array 14 and a mass storage unit 16, all of which connect to a CPU 18 via a host bus 20. System peripherals (eg. printers, terminals, network devices, etc.) typically included in a computer system and known in the art are not shown as they do not directly pertain to the present invention. The nonvolatile memory 12 is where permanent programs are executed and unchanging data is contained. It will also store fundamental operating system I/O routines and unchanging system parameter data. The read/write memory array 14 is where temporary data is stored and variable (eg. applications) programs are executed by the CPU 18 when loaded from the mass storage unit 16. The nonvolatile memory 12 and read/write memory array 14 are directly executable by the CPU 18, while the mass storage unit 16, which is used for short/long-term and archival storage, is considered a secondary source of programs and data. A hierarchical system of mass storage devices within the mass storage unit 16 may include hard disks supplemented with more specialized storage systems such as removable cartridges, RAM disks, cache memory, local processor memory, optical disks and tape drives.

Figure 2:
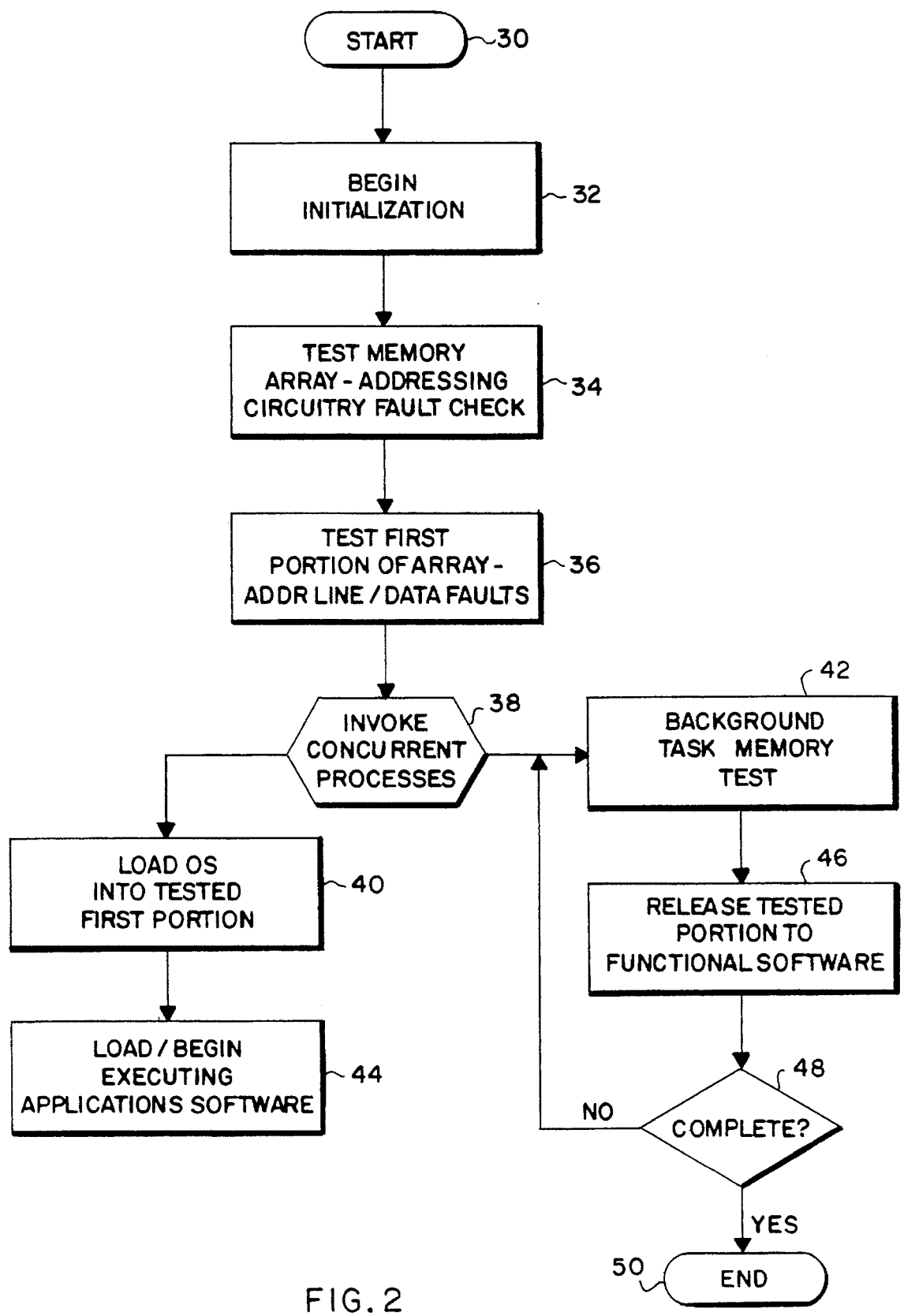
FIG. 2 is a flow diagram of a test method according to the present invention.

Initialization of the computer system 10 can occur by way of a power cycle, a software reset or may be user-invoked. Referring to FIG. 2, a flow diagram illustrates the preferred steps of initialization utilized by the present invention. Upon power-up or reset 30, the CPU 18 begins initialization 32 by performing a self-test and executing a bootstrap program resident within the nonvolatile memory 12. Once completed, the CPU then tests the whole read/write memory array for addressing-related faults according to step 34. When the address line fault testing has been completed, a first portion of the read/write memory array is tested for address line and data faults in step 36. After the testing according to step 36 has been performed, the CPU invokes concurrent processes 38. The operating system (OS) is loaded into the fully tested first portion according to step 40 and the remaining portion of the read/write memory array not tested in step 36 is tested in a background task in step 42. Once the OS has been loaded, the applications software is downloaded and begins to execute in step 44. During the execution of steps 40 and 44, the next portion of the array tested in the background task is released after testing for use by the functional code 46 and the background memory test repeats for sequential portions of the remainder of the array in step 48 and until the remainder has been tested in its entirety. The background memory testing terminates 50, thus concluding the initialization process for the computer system 10 of FIG. 1. Further details of the test method will be discussed later.

Figure 3:
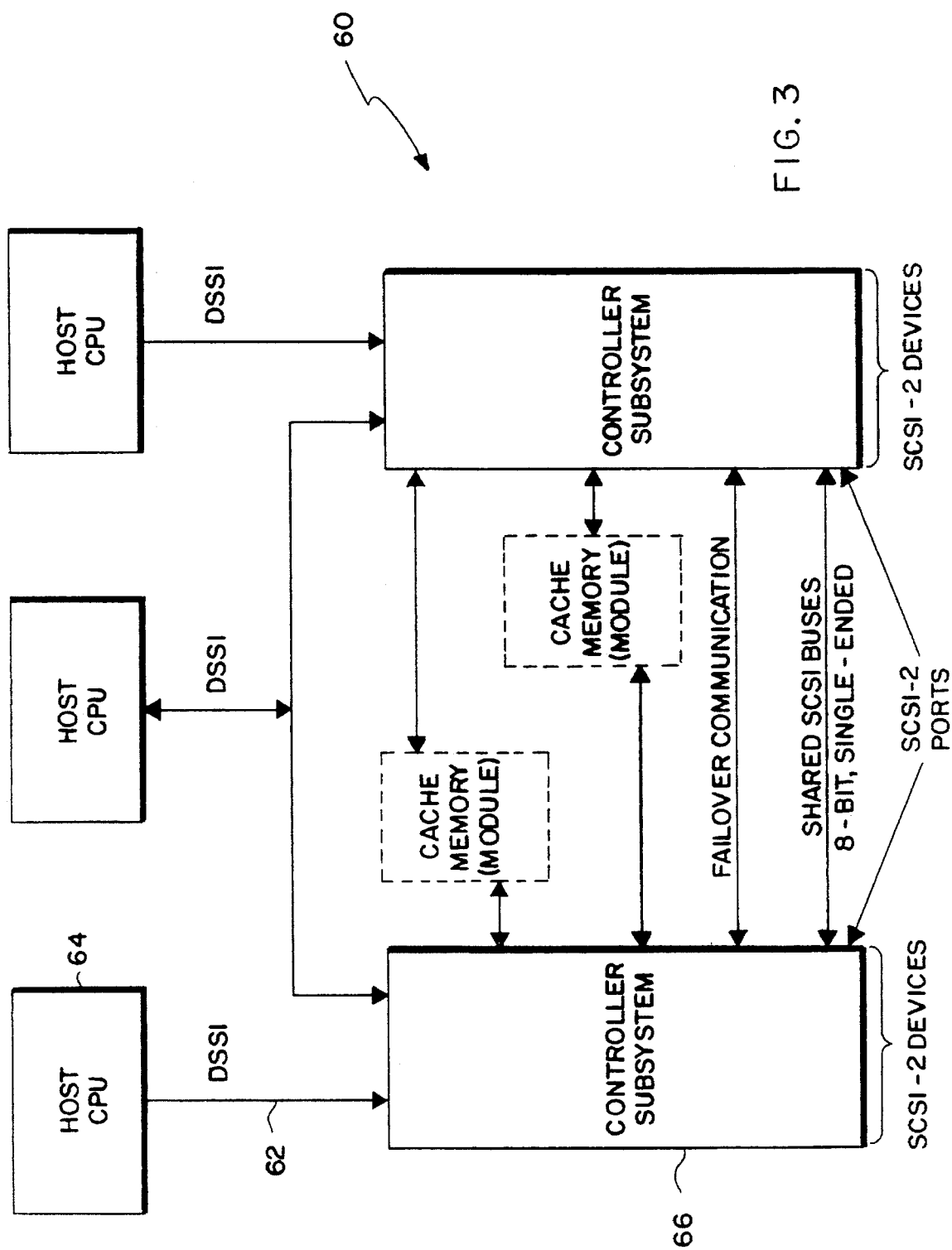
FIG. 3 is a block diagram of a computer system having a storage controller subsystem which includes a cache memory that may be tested by a test method according to the present invention.
Figure 4:
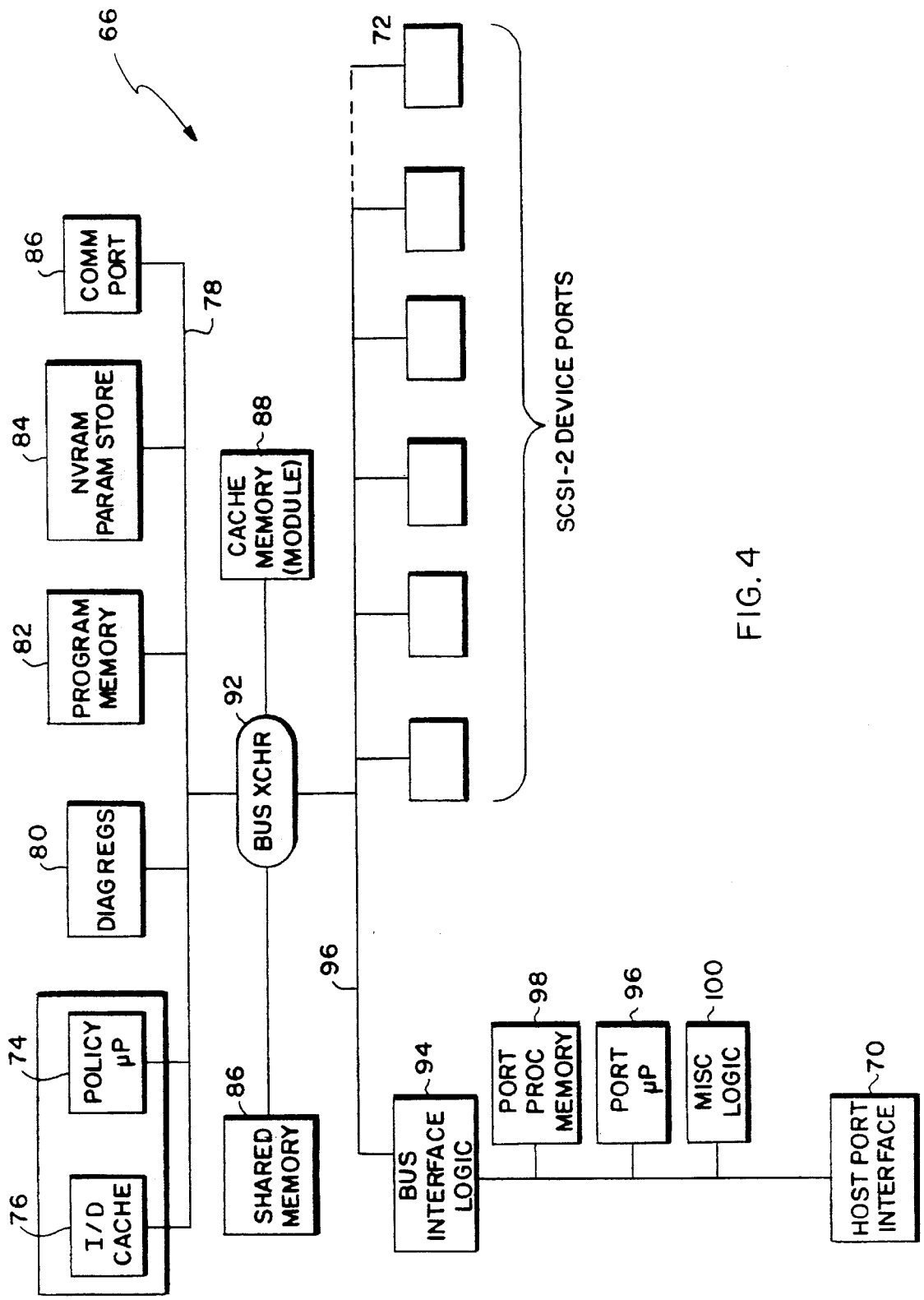
FIG. 4 is a detailed block diagram of the storage controller subsystem shown in FIG. 3.

A more complex system environment which may utilize the method of the present invention is shown in FIGS. 3 and 4. Referring now to FIG. 3, a DSSI-based computer system 60 has a DSSI bus 62 interconnecting host CPUs 64, and storage controller subsystems 66 in dual (and failover) configuration. Alternatively, the host interconnect could be another style of bus (eg. CI, SCSI, FDDI, etc.) The storage controller subsystem 66 of FIG. 3 includes a cache memory (shown here as a module in dash lines). The storage controller subsystem 66 is illustrated in further detail in FIG. 4.

Referring to FIG. 4, a storage controller subsystem 66 bridges the DSSI bus 62 of FIG. 3 (single path) via a host port interface 70 to one or more SCSI-2 device ports 72. The controller subsystem further includes a policy processor 74 and its external instruction/data cache 76. Sharing a native bus 78 used by the policy processor are several memory devices—diagnostic registers 80, a program memory 82, a nonvolatile RAM 84—and a communications port 86. The program memory 82 contains the firmware for the controller and is used each time the controller subsystem boots. The NV RAM 84 stores parameter information entered by a user and by the controller software. The communications port 82 is used for a controller console terminal.

The controller subsystem also includes a share memory 86, which comprises a memory controller and buffer memory, and a cache memory 88. The cache memory 88 includes a large memory array. Using twenty Mbit DRAMs (organized as 4M×4) would give a capacity of 16 Mbytes/bank or 32 Mbytes per module, by way of example. DRAM memory circuitry is well known in the art; hence, the internal memory array, along with the address/data and control lines, are not shown. The separate busses containing the share memory 86 and cache memory 88 are interconnected to the native bus 78 and a bus 90 used to access the DSSI host port interface and serial device ports via a bus exchanger 92. The bus exchanger is a crossbar which provides fast access by all entities to all parts of the controller subsystem. Additionally residing on bus 90 are a bus interface logic element 94, a port processor 96 to support low level device port and host port operations, a port processor memory 98 and a miscellaneous glue-logic element 100.

The initialization of the controller subsystem 66 commences in much the same manner as the computer system of FIG. 1. It can occur via a power cycle, a software reset, or by a user pressing a button on the controller subsystem's control panel (not shown). It may be delayed long enough to allow for cache management to take place and ensure customer data integrity. Once the controller subsystem has booted, it is ready to communicate with a host CPU 64 (shown in FIG. 3.)

Controller subsystem initialization begins with the policy processor 74, which executes a self-test and reads a boot record containing addresses for hardware setup parameters and process control information. Following the processor's initialization, the code in the program memory 82 performs self-test diagnostics on all of the components on the native bus, as well as the shared memory 86. Once completed, code is downloaded from the program memory to the shared memory, where it is then verified. The remaining initialization tests will test the I/D cache 76, SCSI device and host ports, and the cache memory. The cache memory is tested according to the test method of the present invention because of the possible large size of its memory array, the testing of which will greatly increase boot time.

The testing of the potentially large memory array of the cache memory 88 is performed in two parts. Referring once again to steps 34 through 50 of the flow diagram in FIG. 2, the first part includes steps 34 and 36. The second part includes steps 42, 46, 48 and 50.

Figure 5:
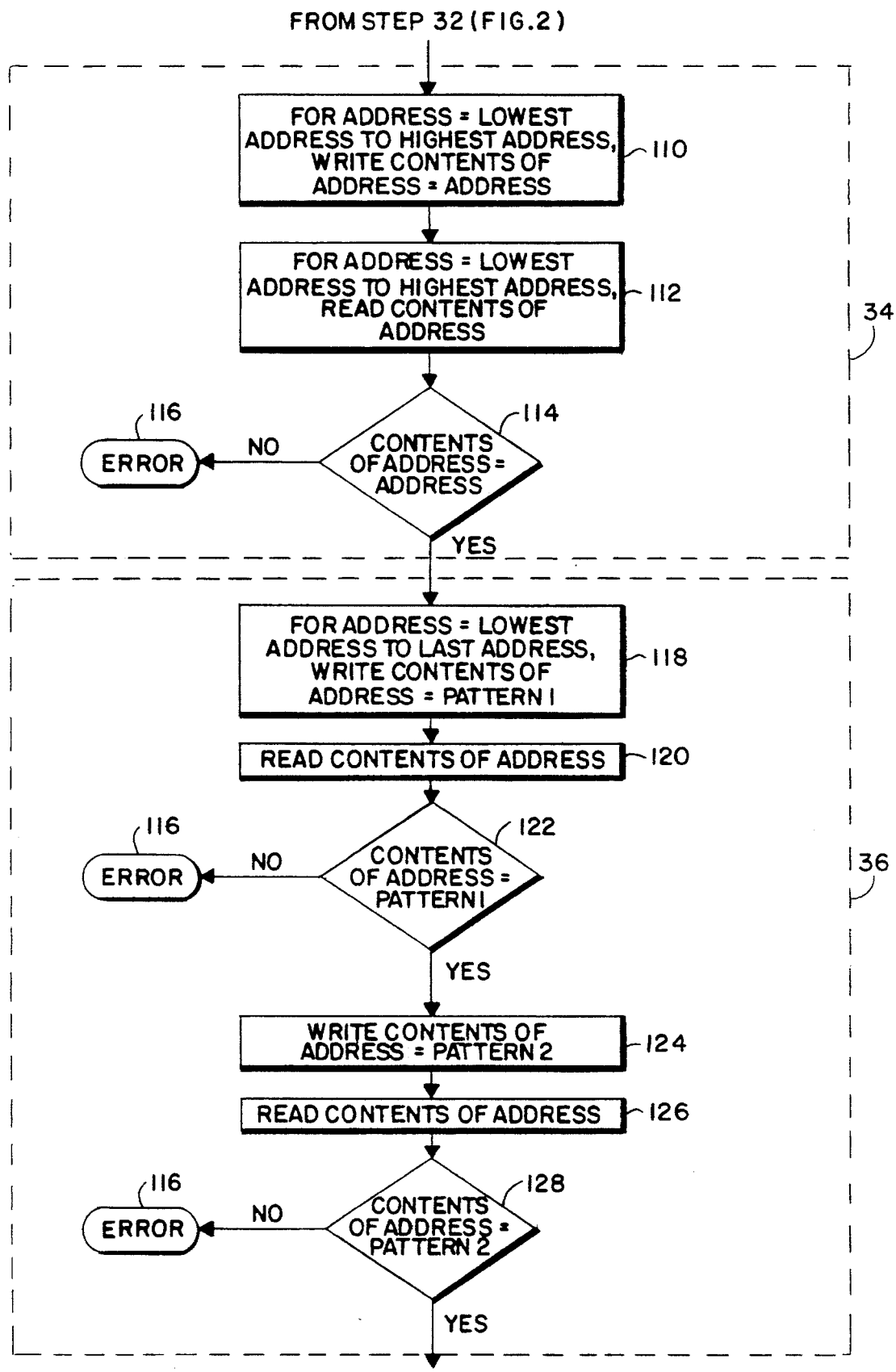
FIG. 5 is a detailed flow diagram of test method steps 34 and 36 of FIG. 2.

Steps 34 and 36 have been expanded in detail as shown in FIG. 5. Referring to FIG. 5, step 34 begins by testing first for addressing-related failures (eg. faults in address lines/decoder circuitry) in the entire array. The contents of each address location of the array are written in a sequential order from lowest to highest address with an address corresponding to the address location being written 110. The contents of each address location are read 112 and compared to the data written for verification 114. If the contents of address location read out are not the same as the address written, an error is flagged. If they are the same, the testing continues with step 36.

Step 36 tests for addressing-related and data faults in a first portion of the array addressed sequentially from the lowest address to a last address, where the last address is lower than the highest address. Ideally, the last address (which defines the size of the first portion) should be selected to give the operating firmware enough memory, such as a first megabyte, to begin execution. The contents of each address location of the array are written in sequential order from lowest address to the last address with a first data pattern 118. Again, the contents are read back 120 to verify that the first data pattern is as written 122. If no error is detected, the contents are written with a second data pattern 124. Again, the contents are read back 126 to verify that the second data pattern is as written 128. If no errors are detected as a result of step 36, then this first portion of the array is ready for use by the operational firmware of the computer system.

At this point in the testing, concurrent processes are invoked, as in step 38 of FIG. 2. While the operational firmware is loaded into and begins executing out of the tested first portion of the array in the foreground (step 40 of FIG. 2), the remainder of the testing is executed in a thread or background task 42.

Figure 6:
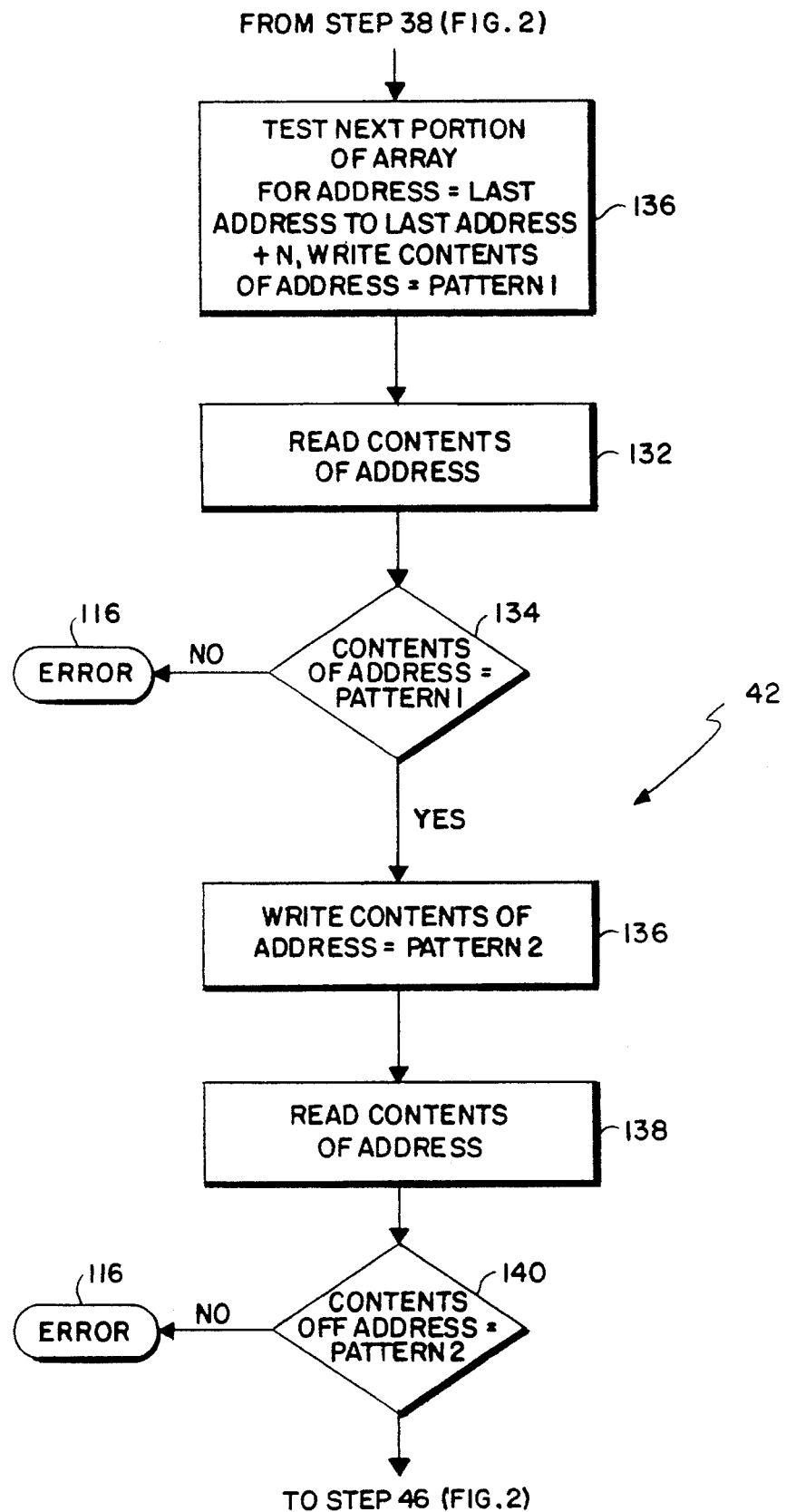
FIG. 6 is a detailed flow diagram of test method step 42 of FIG. 2.
Figure 7:
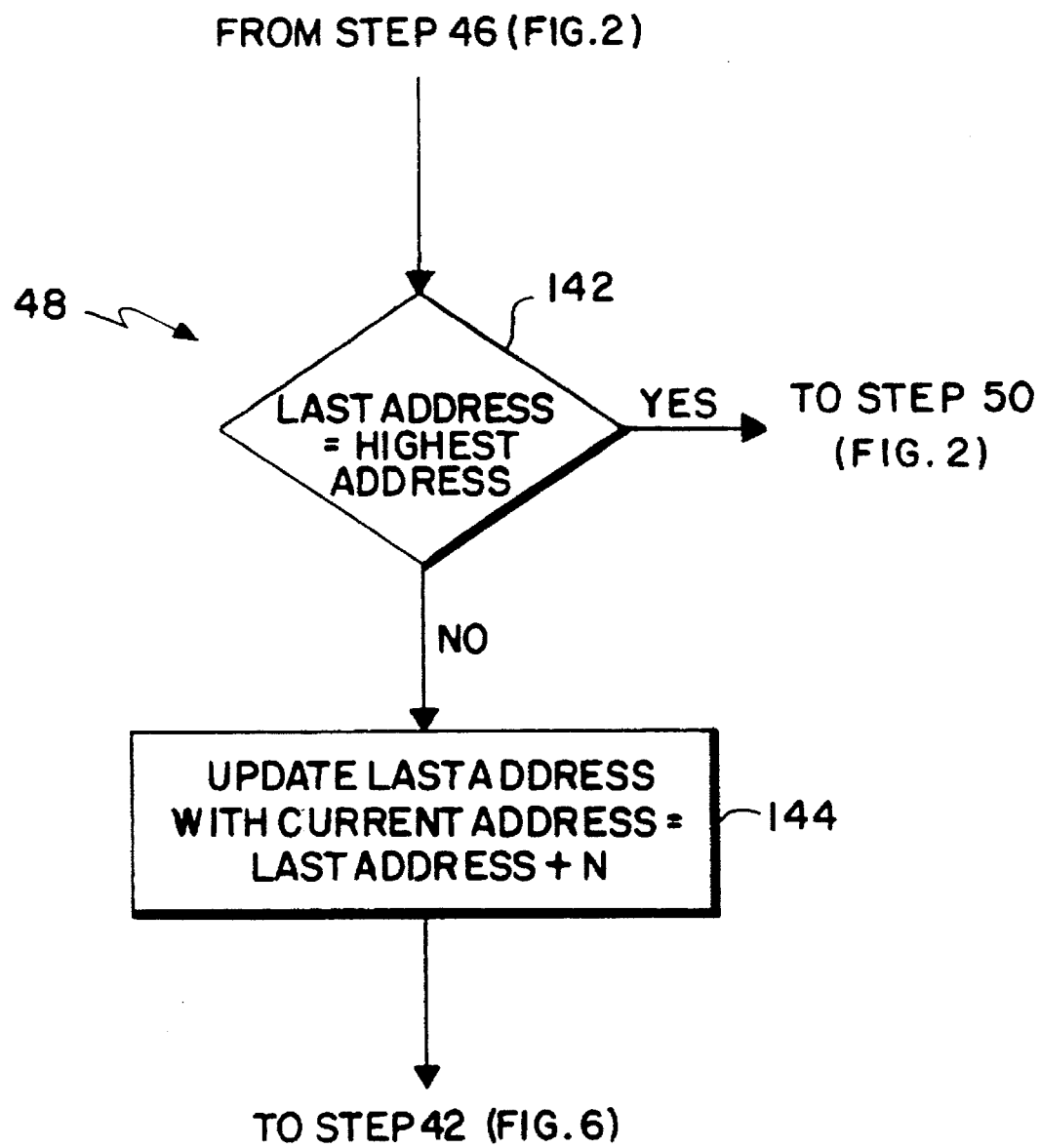
FIG. 7 is a detailed flow diagram of test method step 48 of FIG. 2.

Referring to the expanded detail of step 42 shown in FIG. 6, a next portion of the array addressed sequentially from the last address to a last address+N, when N equals the number of address locations in the next portion of the array to be tested, is tested for addressing and data faults by writing each address location in a sequential order from the last address to the last address+N with the first data pattern 130 and reading out the contents of each location 132 to verify the first data pattern 134. If no errors are detected, the second data pattern is then written 136 and read back 138 to verify that it remains as written 140. If no errors are detected as a result of the step 42, then this tested "next portion" is released to the operational firmware for use. Referring now to FIG. 7, Steps 42 and 46 are then repeated in the background task for a next portion of the array where the last address is updated with the last address+N (eg. the current address) 144 until the last address equals the highest address 142. Once the highest address has been reached, the memory testing is complete.

The time savings achieved by employing the test method of the applicant's invention can be illustrated in the following example.

Consider the case of a memory system having a byte-wide 32M memory array with a read/write time of 100 ns. Let N equal the number of reads/writes executed and T equal the amount of time operating system execution is delayed before "tested good" memory is available.

---

I. A Prior Method:

a) Write 0–32M memory locations    data=55 hex (0101 0101)
   Read 0–32M memory locations     data=55 hex
b) Write 0–32M memory locations    data=AA hex (1010 1010)
   Read 0–32M memory locations     data=AA hex
** T (Prior Method) =
   (memory size × N) × t_read/write
   (32M × 4) × 100 ns
   12.8 s II. Improved Method of Present Invention:

a) Write 0–32M memory locations    data=address
   Read 0–32M memory locations     data=address
b) Write 0–1M memory locations     data=55
   Read 0–1M memory locations      data=55
c) Write 0–1M memory locations     data=AA
   Read 0–1M memory locations      data=AA
** T (Improved Method) =
   [(memory size × N) + (memory size × N)] × t_r/w
   [(32M × 2) + (1M × 4)] × 100 ns
   6.8 s

---

The above example demonstrates the benefit (eg. time savings) associated with the use of the test method according the present invention. Of course, the greatest benefit is realized when testing large memory arrays. For example, increasing the memory size from 32M to 128M will result in T (prior method)=49.2 seconds and a T (improved method)= 26 seconds. Hence, the boot time savings can keep pace relative to ever-increasing memory capacity requirements by using the test method according to the present invention.

Although the above description has proceeded with reference to a specific embodiment of the invention, the invention is not necessarily limited to the particular embodiment shown herein. It is to be understood that various other adaptations and modifications may be made within the spirit and scope of the invention as set forth by the claims.

What is claimed:

1. A method for testing a large memory array of a digital computer system, comprising the steps of:

testing first for addressing-related failures the entire array in a sequential order from a lowest address to a highest address, thereby detecting stuck-at address faults in the array prior to performing address line and data fault testing for the entire array;

testing second for address line and data faults a first portion of the array accessed sequentially from the lowest address to a last address, the last address being lower than the highest address, by writing the contents of each address location of the array with a first data pattern and reading the contents of the address location to verify that the first data pattern remains as written, then writing the contents of the address location with a second data pattern and reading the contents of the address location to verify that the second data pattern remains as written;

making available the first portion of the array for use by operational firmware of the computer system if no errors are detected as a result of the step of address line and data fault testing;

begin executing the operational firmware out of the first portion of the array;

testing third for address line and data faults in a background task a next portion of the array accessed sequentially from the last address to a last address+N, when N is the number of address locations in the next portion of the array to be tested, by writing to each address location the first data pattern and reading the contents of the location to verify the first data pattern remains as written, then writing to the contents of the address location with the second data pattern and reading the contents of the address location to verify that the second data pattern remains as written; and making available to the operational firmware that portion of the array between the last address to the last address+N if no errors are detected as a result of the step of testing the next portion of the array; and repeating in the background task the step of testing the next portion of the array where the last address is updated with the last address+N until the last address equals the highest address.

2. A method for testing a large memory array of a digital computer system as in claim 1 wherein the step of testing first for addressing-related failures in the entire array comprises the steps of:

writing the contents of each address location with an address corresponding to the address location being written; and reading the contents of each address location to verify that the address read out is the same as the address written.

3. A method for testing a large memory array of a digital computer system as in claim 1 wherein the first data pattern is a repeating binary '0101' pattern and the second data pattern is a repeating binary '1010' pattern.

4. A method for testing a large memory array of a digital computer system, comprising the steps of:

testing first for addressing-related failures in the entire array in a sequential order from a lowest address to a highest address by writing the contents of each address location of the array with an address corresponding to the address location being written and reading the contents of each address location to verify that the address read is the same as the address written, thereby detecting any stuck-at address faults in the entire array prior to performing address line and data fault testing for the entire array;

testing second for address line and data faults a first portion of the array accessed sequentially from the lowest address to a last address, the last address being lower than the highest address, by writing the contents of each address location of the array with a first data pattern and reading the contents of the address location to verify that the first data pattern remains as written, then writing to the contents of the address location with a second data pattern and reading the contents of the address location to verify that the second data pattern remains as written;

making available the first portion of the array for use by operational firmware of the computer system if no errors are detected as a result of the step of address line and data fault testing;

begin executing the operational firmware out of the first portion of the array;

testing third for address line and data faults in a background task a next portion of the array accessed sequentially from the last address to a last address+N, when N is the number of address locations in the next portion of the array to be tested, by writing to each address location the first data pattern and reading the contents of the address location to verify the first data pattern remains as written, then writing to the contents of the address location with the second data pattern and reading the contents of the address location to verify that the second data pattern remains as written;

making available to the operational firmware that portion of the array between the last address to the last address+N if no errors are detected as a result of the step of testing the next portion of the array; and repeating in the background task the step of testing the next portion of the array where the last address is updated with the last address+N until the last address equals the highest address.

5. A method for testing a large memory array of a digital computer system as in claim 4 wherein the first data pattern is a repeating binary '0101' pattern and the second data pattern is a repeating binary '1010' pattern.

* * * * *